United States Patent
Madsen

(10) Patent No.: US 7,002,391 B1
(45) Date of Patent: Feb. 21, 2006

(54) SELECTABLE INPUT ATTENUATION

(75) Inventor: Ulrik Riis Madsen, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 68 days.

(21) Appl. No.: 10/400,819

(22) Filed: Mar. 27, 2003

(51) Int. Cl.
H03L 5/00 (2006.01)
(52) U.S. Cl. .............. 327/308; 333/81 R; 330/258
(58) Field of Classification Search .............. 327/306, 327/308; 333/81 R; 330/258, 261
See application file for complete search history.

(56) References Cited

U.S. PATENT DOCUMENTS

| | | | |
|---|---|---|---|
| 3,590,366 A * | 6/1971 | Vaughn et al. .............. 323/354 |
| 3,787,124 A * | 1/1974 | Lowy et al. ................ 356/434 |
| 4,250,492 A * | 2/1981 | Yamakido et al. .......... 341/108 |
| 4,376,267 A * | 3/1983 | Chu et al. ................... 330/284 |
| 5,043,675 A * | 8/1991 | Gilbert ....................... 330/258 |
| 5,117,068 A * | 5/1992 | Seieroe et al. ............ 174/52.4 |
| 5,408,199 A * | 4/1995 | Nagano et al. ............ 330/284 |
| 5,448,506 A * | 9/1995 | Tateno ........................... 708/7 |
| 5,532,718 A * | 7/1996 | Ishimaru .................... 345/211 |
| 5,608,353 A | 3/1997 | Pratt .......................... 330/295 |
| 5,629,648 A | 5/1997 | Pratt .......................... 330/289 |
| 6,130,579 A | 10/2000 | Iyer et al. ................... 330/285 |
| 6,191,656 B1 | 2/2001 | Nadler ....................... 330/288 |
| 6,198,349 B1 * | 3/2001 | Kanno et al. ............... 330/282 |
| 6,229,395 B1 | 5/2001 | Kay ........................... 330/252 |
| 6,265,943 B1 | 7/2001 | Dening et al. ............. 330/296 |
| 6,271,727 B1 | 8/2001 | Schmukler .................. 330/284 |
| 6,285,239 B1 | 9/2001 | Iyer et al. ................... 327/531 |
| 6,307,364 B1 | 10/2001 | Augustine .................... 324/95 |
| 6,313,705 B1 | 11/2001 | Dening et al. ............. 330/276 |
| 6,329,809 B1 | 12/2001 | Dening et al. ............... 324/95 |
| 6,333,677 B1 | 12/2001 | Dening ...................... 330/296 |
| 6,356,150 B1 | 3/2002 | Spears et al. ............... 330/145 |
| 6,369,656 B1 | 4/2002 | Dening et al. ............. 330/296 |
| 6,369,657 B1 | 4/2002 | Dening et al. ............. 330/296 |
| 6,392,487 B1 | 5/2002 | Alexanian .................. 330/254 |
| 6,404,287 B1 | 6/2002 | Dening et al. ............. 330/296 |
| 6,477,054 B1 * | 11/2002 | Hagerup ..................... 361/720 |
| 6,525,611 B1 | 2/2003 | Dening et al. ............. 330/298 |
| 6,528,983 B1 | 3/2003 | Augustine .................... 324/95 |
| 6,566,963 B1 | 5/2003 | Yan et al. ................... 330/311 |

* cited by examiner

*Primary Examiner*—Dinh T Le
(74) *Attorney, Agent, or Firm*—Withrow & Terranova, PLLC

(57) ABSTRACT

Mobile terminal design is made simpler by providing an attenuation circuit having a selectable amount of attenuation within an integrated circuit. In one embodiment, a plurality of input pins are provided so as to connect to different points of the attenuation circuit. By selecting a particular input pin, a given amount of attenuation is available between the chosen input pin and the output pin. In a second embodiment, resistors within the attenuation circuit are selectively grounded to vary the amount of attenuation between the input pin and the output pin.

11 Claims, 6 Drawing Sheets

SELECTABLE INPUT ATTENUATION

FIELD OF THE INVENTION

The present invention relates to a technique by which an attenuation circuit may be incorporated into an integrated circuit such as a power amplifier.

BACKGROUND OF THE INVENTION

The world of integrated circuits has seen explosive growth and innovation since its inception. Integrated circuits are typically silicon wafers doped in such a manner as to create semiconductor devices thereon, although other permutations such as Gallium Arsenide integrated circuits do exist. The integrated circuits are mounted on printed circuit boards and connected to traces so that the components within the integrated circuit may be used. As the integrated circuit industry has matured and transistor size has decreased, integrated circuits have become more complex and able to do more things while taking up less space.

Integrated circuits are now used for any number of components within myriad devices. For example, televisions, stereos, computers, and the like all use integrated circuits in transmitters, modems, signal processors, and the like. Integrated circuits, despite their power and versatility, are relatively fragile. Specifically, if the integrated circuit receives an input signal with a power level that exceeds the integrated circuit's tolerances, the integrated circuit may be damaged or destroyed.

To minimize the risk of exposing an integrated circuit to excessively powerful input signals, most circuit designers use attenuation circuits composed of resistive components to attenuate input signals to a desired, tolerable level. These attenuation circuits are typically positioned proximate the integrated circuits, albeit off chip, on the printed circuit board within the device that uses the integrated circuit.

In most instances, the existence of off chip attenuation circuits is not unduly burdensome. However, for the class of electronic products known generally as mobile terminals and including cellular phones, laptop computers, personal digital assistants, pagers, and the like, where space within the device is a premium, the existence of off chip components can be a severe design strain. Further, some mobile terminals operate in two or more frequency band modes. It is not uncommon to have different power level tolerances based on the frequency band mode in which the device is operating. Thus, the number of attenuation circuits may double or triple in such multimode devices. As already noted, because space within mobile terminals is a premium and because increased component counts increase costs, it is desirable to have an alternate technique by which attenuation circuits could be provided for use in mobile terminals.

SUMMARY OF THE INVENTION

The present invention provides a technique to improve attenuation circuits and is especially well suited for use in a mobile terminal. Specifically, the present invention moves an attenuation network circuit into the integrated circuit such that no external, off chip attenuation is required. The present invention is well suited for virtually any integrated circuit, but is especially well suited for use in a power amplifier integrated circuit.

In a first exemplary embodiment, the attenuation circuit has a plurality of resistive (or otherwise loss-inducing) elements, a plurality of inputs, and an output. The inputs and output may be pins or contacts on the integrated circuit chip and are suitable for connection to traces on the printed circuit board by soldering or other technique. The amount of attenuation present between the input and the output varies depending on which input is used. Specifically, the attenuation network may have an attenuation value of X dB between the first input and the output; an attenuation value of Y dB between the second input and the output; and an attenuation value of Z dB between the third input and the output, where X>Y>Z. When a circuit designer is designing a printed circuit board for incorporation into a device, the circuit designer compares the output of an upstream component to the acceptable input of the integrated circuit that incorporates the attenuation network. From this comparison, the circuit designer may determine how much attenuation is required. When the integrated circuit incorporating the attenuation network is secured to a printed circuit board, the output of the upstream component is connected via a trace on the printed circuit board to the input of the attenuation network that provides the desired attenuation. The output from the attenuation network is connected via another trace to an input for the other processing circuitry within the integrated circuit.

In a second embodiment, the attenuation network has a single input and a single output as well as a plurality of jumper points. The input, output, and jumper points may be pins or contacts on the integrated circuit chip and are suitable for connection to traces on a printed circuit board by soldering or the like. The attenuation of the attenuation network is changed by changing how the jumper points are terminated. Specifically, a jumper point may be shorted to ground, left as an open circuit, or connected to another jumper point. These changes may be achieved by appropriately connecting the jumper point to a trace on the printed circuit board as needed. When a circuit designer is designing a printed circuit board for incorporation into a device, the circuit designer compares the output of an upstream component to the acceptable input of the integrated circuit that incorporates the attenuation network. From this comparison, the circuit designer may determine how much attenuation is required. When the integrated circuit incorporating the attenuation network is secured to a printed circuit board, the input of the attenuation circuit is connected to the output of the upstream component. The jumper points are also connected to the printed circuit board and/or one another as needed to provide the attenuation network with the desired attenuation. These connections are achieved by connecting the traces to the contact points or pins on the integrated circuit chip as needed or desired through soldering or the like.

The use of the present invention eliminates the need for off chip attenuation networks, thereby helping to reduce component counts and reduce the size of the device into which the integrated circuit is incorporated. Further, the selectively variable nature of the attenuation network gives circuit designers flexibility in using components with different input requirements.

Those skilled in the art will appreciate the scope of the present invention and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention places an attenuation network within an integrated circuit chip to simplify board design and reduce component counts in electronic devices. The present invention is well suited for use in mobile terminals such as cellular phones, pagers, personal digital assistants, and the like. To understand the benefits of the present invention, a review of the prior art and its limitations is presented in FIGS. 1A–2B.

Figure 1A:
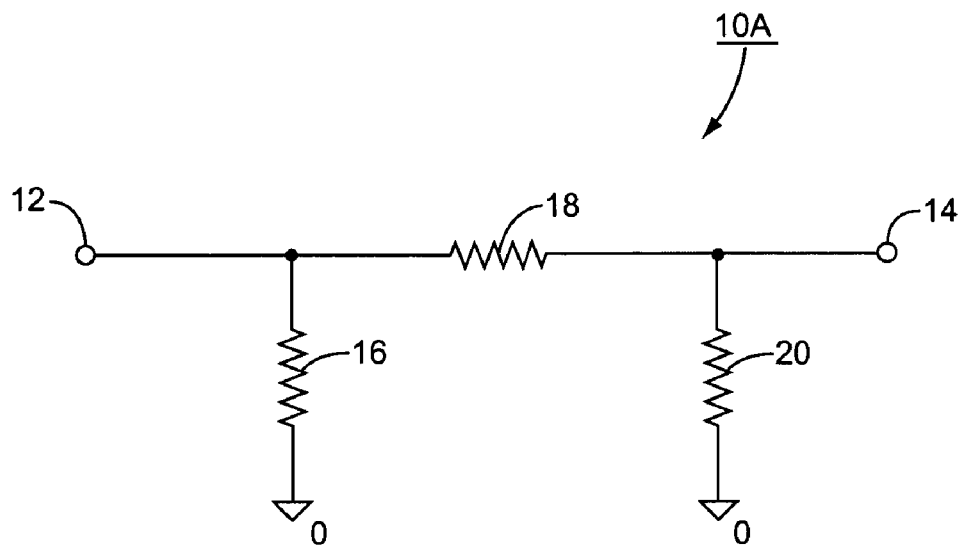
FIGS. 1A and 1B illustrate prior art attenuators.
Figure 1B:
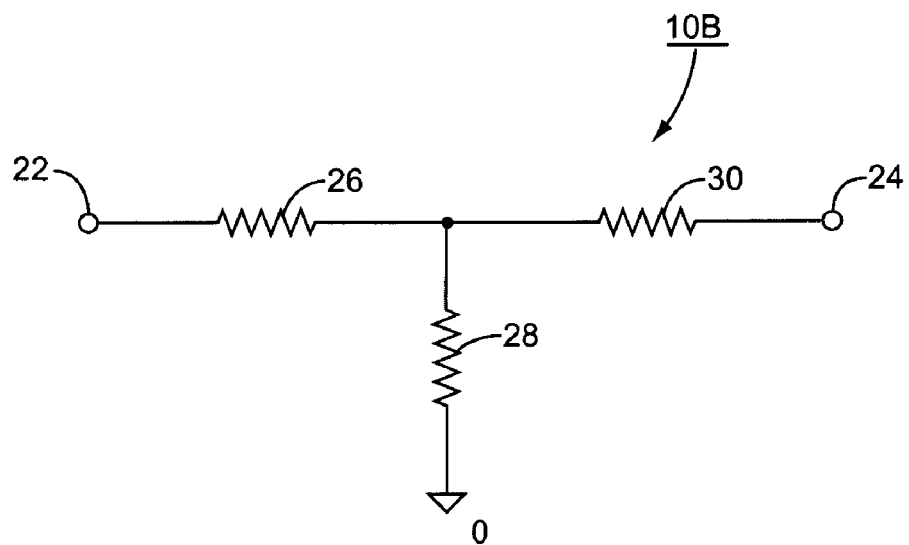

FIGS. 1A and 1B illustrate attenuator networks that are commonly used in circuit design. For example, FIG. 1A illustrates a "Pi" or "π" attenuator network 10A. Pi attenuator network 10A has an input 12 and an output 14. Between input 12 and output 14 are three loss-inducing elements, namely resistors 16, 18, and 20. Resistors 16 and 20 are connected to ground, while resistor 18 is serially positioned between input 12 and output 14. The values of resistors 16, 18, and 20 are chosen by the circuit designer to provide a desired amount of attenuation between input 12 and output 14 as is well understood. Alternatively, the circuit designer may chose values for resistors 16, 18, and 20 to provide a desired input/output VSWR (also known as return loss) as is well understood. When in use in an electronic device, resistors 16, 18, and 20 are soldered or otherwise attached to a printed circuit board proximate an integrated circuit chip.

FIG. 1B illustrates a "T" attenuator network 10B. T attenuator network 10B has an input 22 and an output 24. Between input 22 and output 24 are three loss-inducing elements, namely resistors 26, 28, and 30. Resistor 28 is connected to ground, while resistors 26 and 30 are serially positioned between input 22 and output 24. The values of resistors 26, 28, and 30 are chosen by the circuit designer to provide a desired amount of attenuation between input 22 and output 24 as is well understood. When in use in an electronic device, resistors 26, 28, and 30 are soldered or otherwise attached to a printed circuit board proximate to an integrated circuit chip.

Figure 2A:
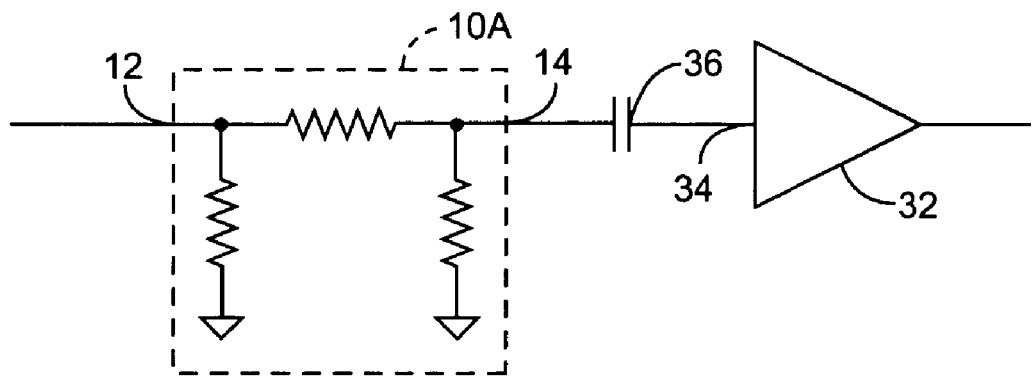
FIGS. 2A and 2B illustrate prior art attenuators as used with a power amplifier.
Figure 2B:
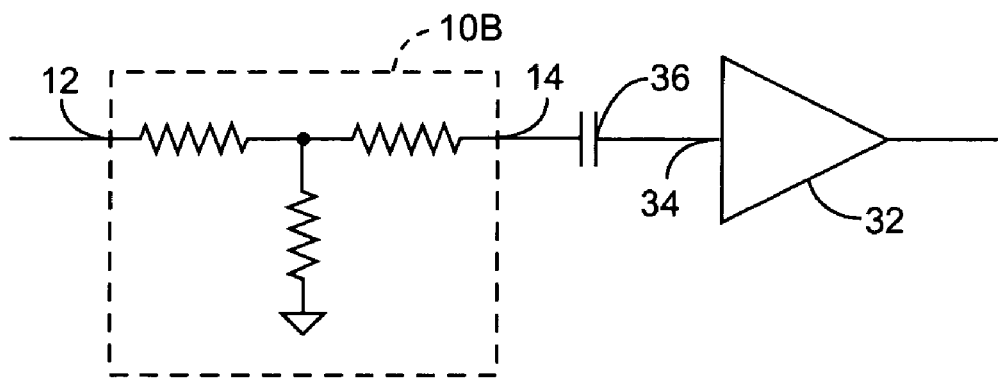

As an example of the way in which the attenuator networks of FIGS. 1A and 1B can be used, reference is made to FIGS. 2A and 2B respectively. As illustrated in FIG. 2A, Pi attenuator network 10A is associated with a power amplifier 32. Specifically, Pi attenuator network 10A is positioned upstream of an input 34 of the power amplifier 32. A capacitor 36 may remove DC signals from the signal as is well understood. A signal to be amplified is presented at the input 12, attenuated, and passed out the output 14 to the capacitor 36. Once the DC component has been removed, the signal is presented to the input 34 of the power amplifier 32 and the signal is amplified as desired. Similarly, the T attenuator network 10B may be associated with the power amplifier 32 as illustrated in FIG. 2B.

In both cases, the power amplifier 32 may be a commercially available power amplifier such as the RF 5117 sold by RF Micro Devices, Inc. of Greensboro, N.C. It is packaged as a single integrated circuit chip and is able to be secured to a printed circuit board or the like for incorporation into a device as is well understood.

In contrast, the present invention is designed to be incorporated into the integrated circuit for which attenuation is desired. In many instances, an integrated circuit chip may have unused pins. The present invention takes advantage of this fact by associating an attenuation network with these pins. Before illustrating how this would work, exemplary attenuation networks are described with respect to FIGS. 3 and 5.

Figure 3:
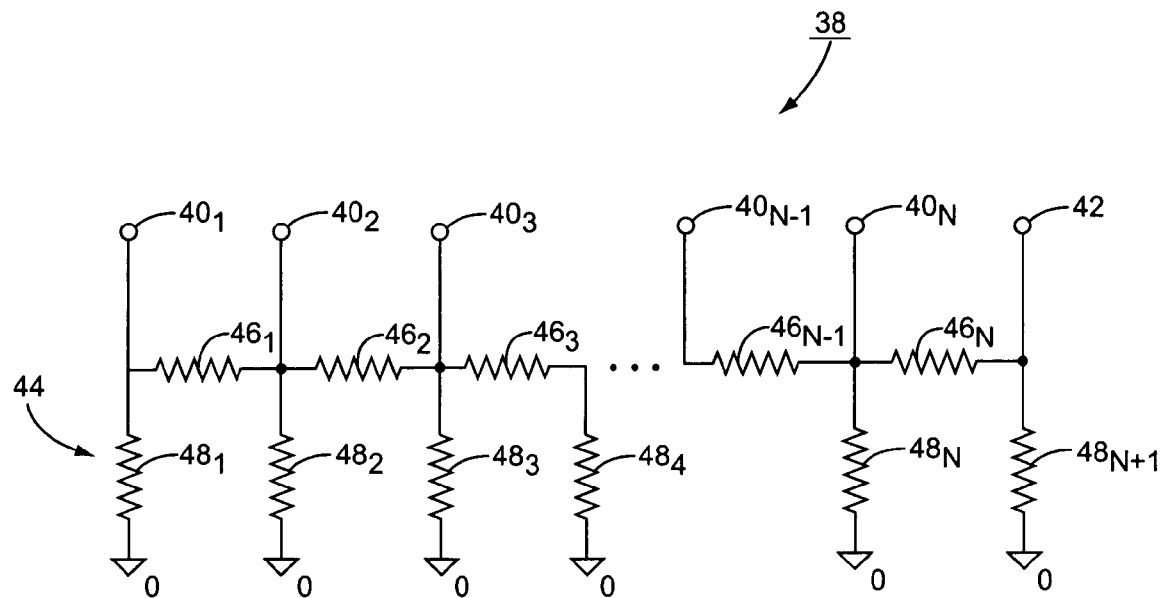
FIG. 3 illustrates a circuit diagram of a first embodiment of an attenuation network of the present invention.

FIG. 3 illustrates a first embodiment of an attenuation network 38 that is well suited for use in the present invention. Attenuation network 38 includes a plurality of inputs 40 (labeled $40_1$ to $40_N$), an output 42, and a plurality of loss-inducing elements 44. The loss-inducing elements 44 include, in this embodiment, serial resistors 46 (labeled $46_1$ to $46_N$) and grounding resistors 48 (labeled $48_1$ to $48_{N+1}$). The serial resistors 46 are serially positioned between the inputs 40 and the output 42, while the grounding resistors 48 are connected to a ground plane or a grounding pin within the integrated circuit. Serial resistors 46 and grounding resistors 48 may be of any appropriate value, but are, in an exemplary embodiment, in the range of 3 to 1000 ohms. As is readily understood, the attenuation $X_1$ (sometimes called herein an "attenuation value") between input 40, and output 42 is greater than the attenuation $X_2$ between input $40_2$ and output 42, which in turn is greater than the attenuation $X_N$ between input $40_N$ and output 42. The values of the attenuation X are set by the values of the resistors 46 and 48 and are known a priori by the circuit designer. The circuit designer can easily select the input 40 that provides the desired attenuation for the circuit being designed.

Figure 4:
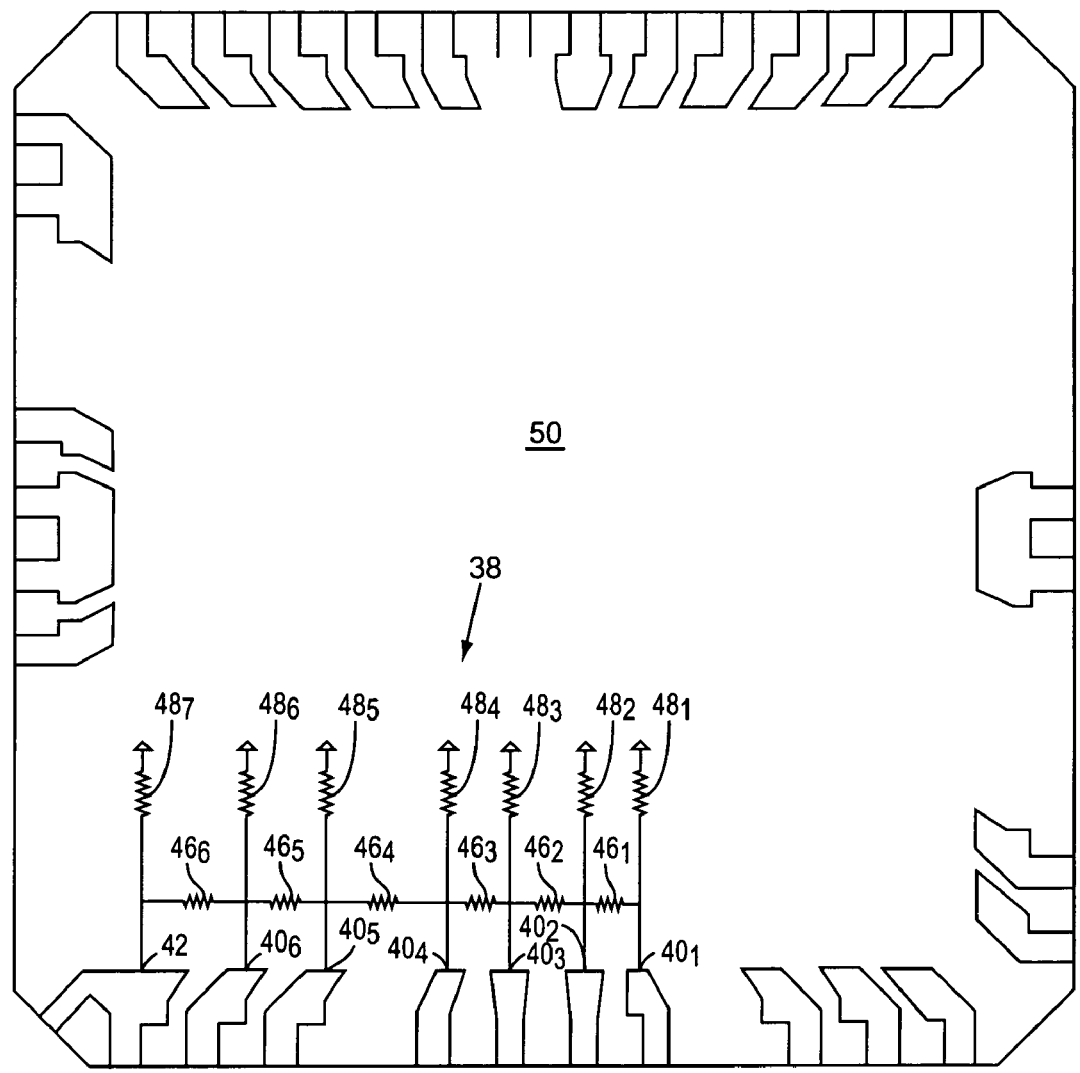
FIG. 4 illustrates the attenuation network of FIG. 3 incorporated into an integrated circuit chip.

Each input 40 and the output 42 is adapted to be connected to a pin or contact on an integrated circuit chip 50 as illustrated in FIG. 4. As further illustrated in FIG. 4, there are six inputs $40_1$ to $40_6$ and the single output 42. The attenuation between a given input 40 and the output 42 is a function of the serial resistors 46 and the grounding resistors 48. When the integrated circuit chip 50 is secured to a printed circuit board, the appropriate pins are connected to the traces on the printed circuit board as is well understood.

Figure 5:
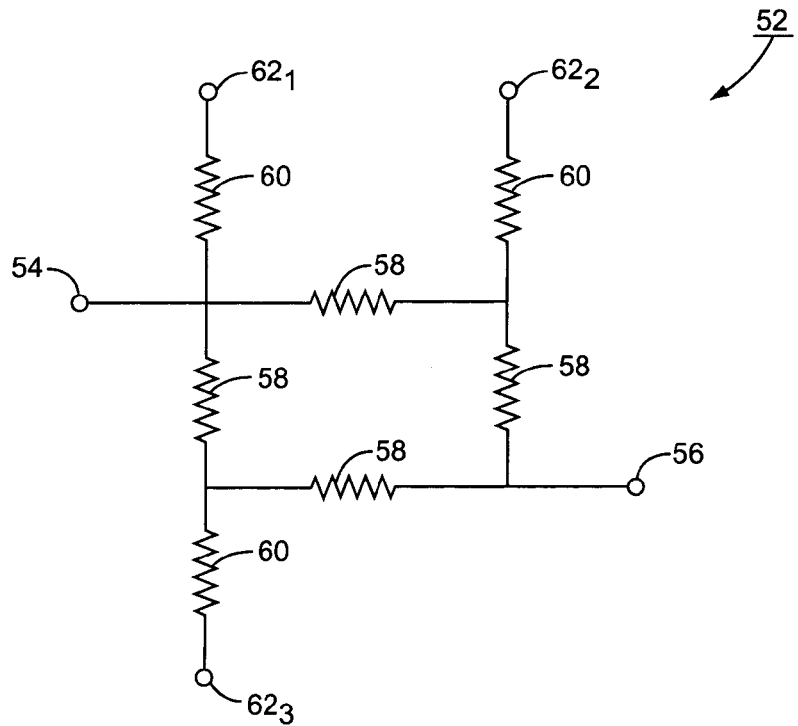
FIG. 5 illustrates a circuit diagram of a second embodiment of an attenuation network of the present invention.

FIG. 5 illustrates an alternate embodiment of an attenuation network 52. Attenuation network 52 includes an input 54 and an output 56. Positioned between input 54 and output 56 are bridge resistors 58. Additionally, jumper resistors 60 connect the attenuation network 52 to jumper points 62. Bridge resistors 58 and jumper resistors 60 may be of any appropriate value, but are, in an exemplary embodiment, in the range of 10 to 1000 ohms.

The attenuation provided by the attenuation network 52 is a function of the values of the resistors 58, 60 as well as how the jumper points 62 are terminated. Jumper points 62 may be left as open circuits, terminated to ground, connected one to another, or some combination of these termination options. For example, jumper point $62_1$ may be terminated to ground while jumper point $62_2$ is connected to jumper point $62_3$ by a trace on the printed circuit board. Other arrangements are also possible. Attenuation network 52 may be incorporated into an integrated circuit chip 50 (FIG. 4) much as attenuation network 38 is incorporated into the integrated circuit chip 50 with input 54, output 56, and jumper points 62 connected to the pins of the integrated circuit chip 50. The circuit designer knows a priori the values of the resistors 58 and 60 and can create a desired amount of attenuation between input 54 and output 56 by making the needed terminations to the jumper points 62.

It should further be appreciated that a more elaborate network of bridge resistors 58 and more or fewer jumper resistors 60 and jumper points 62 may be used if needed or desired. Further, other passive components such as inductors and capacitors may be incorporated therein. The embodiment of FIG. 5 is for illustrative purposes only.

Figure 6:
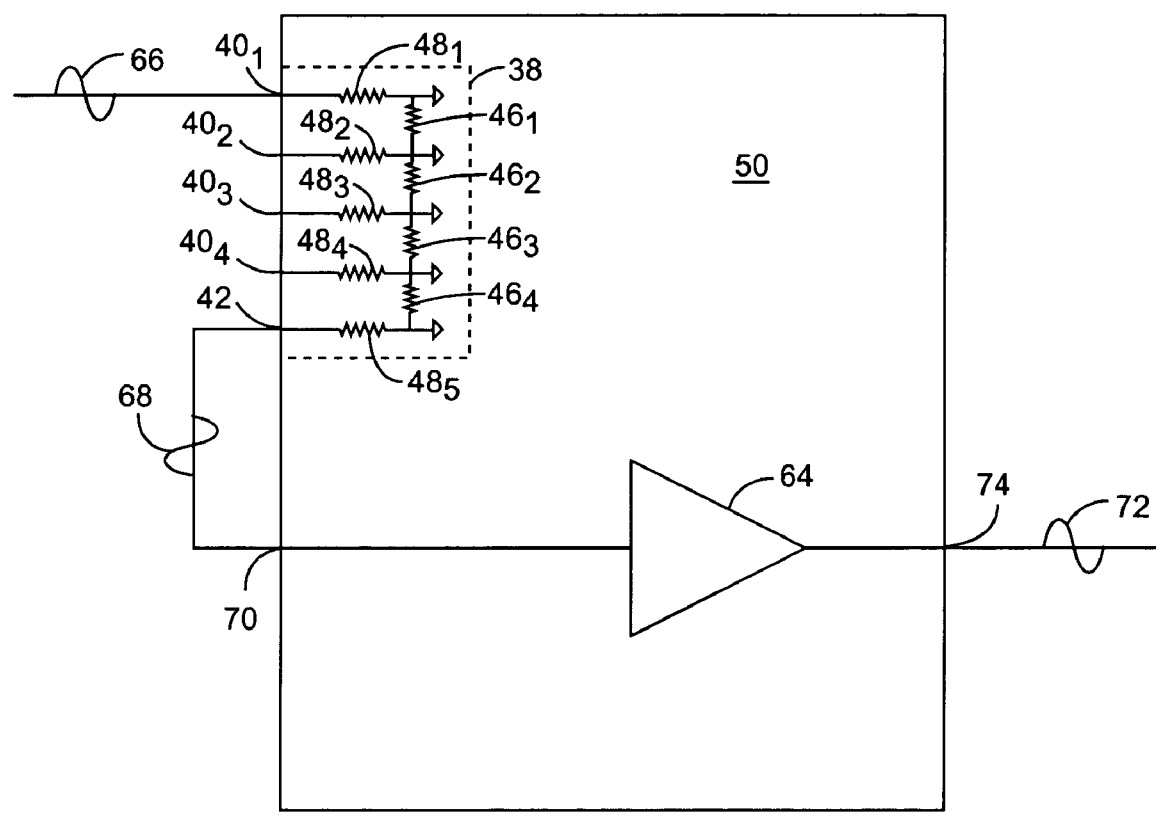
FIG. 6 illustrates an attenuator incorporated into an integrated circuit that houses amplifier circuitry.

The attenuation networks 38, 52 of the present invention are well suited for incorporation into almost any integrated circuit chip 50. For example, as illustrated in FIG. 6, a single integrated circuit chip 50 may be created that includes both an attenuator network 38 and a power amplifier 64. While the present disclosure will focus on a power amplifier embodiment, it should be appreciated that the teachings of the present invention could easily be adapted for use in other integrated circuits, such as baseband processor integrated circuits, transceiver integrated circuits and the like. In this particular embodiment, a signal 66 arrives at a selected attenuator input 40 (in this example, $40_1$), and an attenuated signal 68 is output from the output 42. Other inputs $40_2$, $40_3$, or $40_4$ could also have been chosen by the designer if needed by the requirements of the power amplifier 64 or otherwise desired. The attenuated signal 68 is directed back onto the integrated circuit chip 50 at an input 70 where the power amplifier 64 amplifies the signal and generates an output signal 72 that is present at an amplifier output 74.

Figure 7:
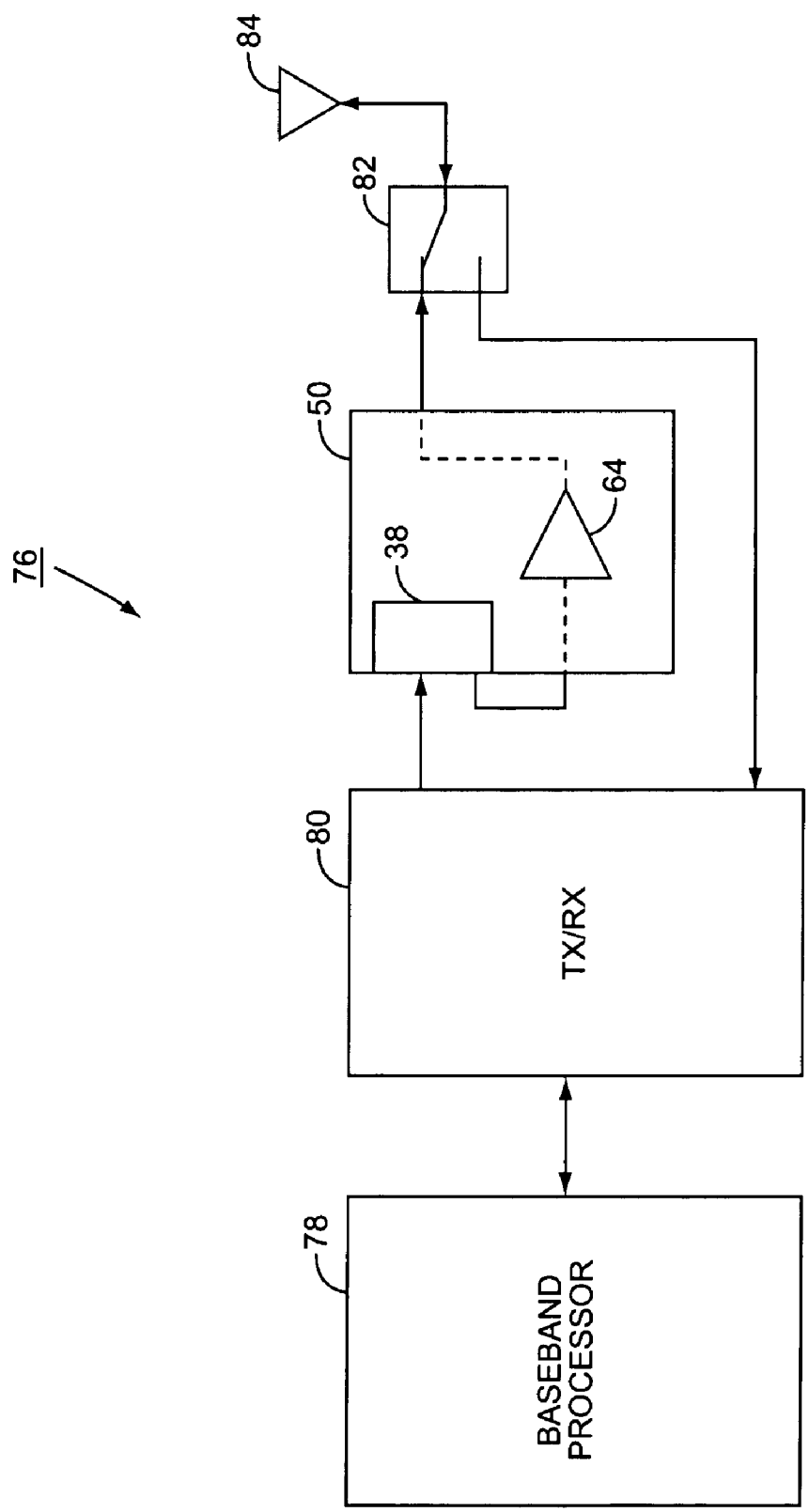
FIG. 7 illustrates the integrated circuit of FIG. 6 incorporated into a transceiver.

In use, the integrated circuit chip 50 may be used as part of a transmitter 76, as illustrated in FIG. 7. Specifically, the transmitter 76 may include a baseband processor integrated circuit 78, a transceiver (Tx/Rx) integrated circuit 80, the power amplifier integrated circuit chip 50, a switch 82, and an antenna 84. A suitable exemplary transceiver integrated circuit is the RF 2948B made by RF Micro Devices, Inc. of Greensboro, N.C., although others are likewise suitable for use with the present invention. The switch 82 may switch between a transmit mode and a receive mode as is well understood.

While FIG. 7 shows the present invention incorporated into a transmitter 76, it should be appreciated that numerous other devices could also benefit from the present invention, such as microprocessors, the baseband processor integrated circuit 78, the transceiver integrated circuit 80, or the like.

It should be appreciated that the embodiment of FIG. 3 is well suited for use with a multimode transmitter or other device. A circuit designer could introduce a signal at a first frequency to one input 40 and a signal at a second frequency to a second input 40. In such a manner, the attenuation provided to each signal could be crafted to match the needs of that operating frequency. For example, input $40_1$ could be used for a 900 MHz signal, and input $40_3$ could be used for a 1800 MHz signal. Other arrangements are also possible.

Those skilled in the art will recognize improvements and modifications to the preferred embodiments of the present invention. All such improvements and modifications are considered within the scope of the concepts disclosed herein and the claims that follow.

What is claimed is:

1. A power amplifier integrated circuit chip comprising:
   an attenuation network comprising:
      a plurality of inputs positioned on said power amplifier integrated circuit chip and providing a plurality of external input connections to said power amplifier integrated circuit chip;
      an output positioned on said power amplifier integrated circuit chip and providing an external output connection from said power amplifier integrated circuit chip; and
      a plurality of resistors arranged between said plurality of inputs and said output, wherein different attenuation values are achieved by externally applying a signal from different ones of said plurality of inputs to said output; and
   power amplifier circuitry having an input positioned on said power amplifier integrated circuit chip providing an external input connection to said power amplifier circuitry, wherein the input of the power amplifier circuitry is coupled to the output of the attenuation network by an external connection.

2. The power amplifier integrated circuit chip of claim 1 wherein each of said plurality of inputs is associated with a serial resistor and a grounding resistor from within said plurality of resistors.

3. The power amplifier integrated circuit chip of claim 2 wherein the attenuation network further comprises an additional grounding resistor associated with said output.

4. A power amplifier integrated circuit chip comprising:
   an attenuation network comprising:
      a plurality of inputs positioned on said power amplifier integrated circuit chip and providing a plurality of external input connections to said power amplifier integrated circuit chip, wherein an input signal is applied to one of the plurality of external input connections;
      an output positioned on said power amplifier integrated circuit chip and providing an external output connection from said power amplifier integrated circuit chip; and
      a plurality of resistors arranged between said plurality of inputs and said output, wherein different attenuation values are achieved by selectively grounding different ones of said plurality of resistors by externally grounding corresponding ones of said plurality of inputs; and
   power amplifier circuitry having an input positioned on said power amplifier integrated circuit chip providing an external input connection to said power amplifier circuitry, wherein the input of the power amplifier circuitry is coupled to the output of the attenuation network by an external connection, wherein said attenuation network attenuates the input signal for processing by said power amplifier circuitry on said power amplifier integrated circuit chip.

5. The attenuation network of claim 4 wherein said different attenuation values are further achieved by selectively shorting different ones of said plurality of resistors by shorting corresponding ones of the plurality of inputs.

6. An integrated circuit chip comprising:
   an attenuation network comprising:
      a plurality of inputs providing a plurality of external input connections to said integrated circuit chip;

an output providing an external output connection from said integrated circuit chip; and a resistive network comprised of serial resistors and grounding resistors arranged between said plurality of inputs and said output in such a manner that a signal passing from each one of said plurality of inputs to said output is attenuated by a unique attenuation value, wherein the unique attenuation value between said plurality of inputs and said output is selected by selectively applying a signal to one of the plurality of inputs; and additional circuitry having an input positioned on said integrated circuit chip providing an external input connection to said additional circuitry, wherein the input of the additional circuitry is coupled to the output of the attenuation network by an external connection.

7. An integrated circuit comprising:

a first plurality of external connection points;

an attenuation network comprising:

a plurality of interconnected loss-inducing elements; and a plurality of inputs associated with the plurality interconnected loss-inducing elements and connected to corresponding ones of the first plurality of external connection points;

an external input connection point;

an external output connection point; and power amplifier circuitry having an input connected to the external input connection point and an output connected to the external output connection point;

wherein the external input connection point is coupled to a first one of the first plurality of external connection points via an external connection and an input signal is provided to a second one of the first plurality of external connection points such that the input signal is attenuated by an attenuation value and an attenuated version of the input signal is provided to the input of the power amplifier circuitry, further wherein the attenuation value is dependent on which of the of the first plurality of external connection points are selected as the first and second ones of the plurality of external connection points.

8. The integrated circuit of claim 7 wherein the external connection comprises a trace on a printed circuit board.

9. The integrated circuit of claim 7 wherein said attenuation value of the attenuation network is selectively configured by selectively terminating select ones of the first plurality of external connection points other than the first and second ones of the plurality of first external connection points using corresponding external connections.

10. The integrated circuit of claim 9 wherein at least one of the select ones of the first plurality of external connections is coupled to ground using an external connection.

11. The integrated circuit of claim 9 wherein at least two of the select ones of the first plurality of external connections are coupled to one another using an external connection.

* * * * *